(12) United States Patent
Nygren

(10) Patent No.: US 7,024,326 B2
(45) Date of Patent: Apr. 4, 2006

(54) METHOD OF OPTIMIZING THE TIMING BETWEEN SIGNALS

(75) Inventor: Aaron John Nygren, Munich (DE)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 10/835,393

(22) Filed: Apr. 30, 2004

(65) Prior Publication Data

US 2005/0246118 A1    Nov. 3, 2005

(51) Int. Cl.
*G01R 35/00* (2006.01)
(52) U.S. Cl. ........................................................ 702/89
(58) Field of Classification Search .................. 702/72, 702/85–89, 106–107, 117, 125, 176; 324/601, 324/617; 73/1.42
See application file for complete search history.

(56) References Cited

U.S. PATENT DOCUMENTS 6,834,255 B1 *  12/2004  Abrosimov et al. ......... 702/181
2003/0236641 A1 *  12/2003  Liou ............................ 702/89

* cited by examiner

*Primary Examiner*—John Barlow
*Assistant Examiner*—Jonathan Moffat
(74) *Attorney, Agent, or Firm*—Slater & Matsil, L.L.P.

(57) ABSTRACT

A method of optimizing the timing between signals to be latched and a respective latching clock signal is suggested wherein test timings are provided according to which a delay test value of a clock delay line (CDL) are generated. According to the delay test values a clock signal (C) and a sample signal (S) are received through said clock delay line (CDL) and through said sample signal line (SSL), respectively. Respective phase differences for the distinct delay test values are obtained. A delay value is chosen and set for operation for which the respective obtained phase difference fits best to given target timing data.

19 Claims, 3 Drawing Sheets

METHOD OF OPTIMIZING THE TIMING BETWEEN SIGNALS

FIELD OF THE INVENTION

The present invention relates to a method of optimizing the timing between signals and in particular to a method of optimizing the timing between signals to be latched and a respective latching clock signal with respect to a given circuitry arrangement. The present invention further relates to a method for latching received signals as well as to an apparatus for optimizing the timing between signals.

BACKGROUND OF THE INVENTION

Synchronous signals which are transferred to a semiconductor circuitry arrangement and in particular to a memory chip or the like are often subject of a storing process or latching process. Such a storing process or latching process for instance in memory chip applications is initialized and ruled by respective clock signals. After receiving e.g. multiple synchronous signals from external the respective synchronous signals to be latched and the respective latching signal or latching clock signal may suffer different delay processes when traveling along the different data line arrangements. It is therefore necessary to observe that a correct timing between the signals to be latched and the latching clock signal can be obtained or maintained. That means that a correct timing between the signals to be latched and the latching clock signal is only given if certain timing boundaries between the signals to be latched and the latching clock signal are fulfilled.

In order to adapt the delay of a latching clock signal to the delay of the signals to be latched and therefore in order to adapt respective signal phases it is known in the art to provide certain compensation strategies, for instance by applying an additional and artificial delay to the respective latching clock signal. However, in doing so the respective circuitry arrangements become comparable complex as such circuitry arrangements are built up for instance as dynamic clock alignment circuits which use delay locked loops DLL or phase locked loops PLL in each case with a dynamic feedback arrangement. In particular the involved DLL circuits and the PLL circuits and the respective dynamic feedback loops make the dynamic clock alignment circuits too complex and too area space-consuming and therefore prohibit a multiple employment or usage of such circuits within a given semiconductor circuitry.

OBJECT OF THE INVENTION

It is therefore an object of the present invention to provide a method of optimizing the timing between signals which is inherently stable and reliable and which can be at the same time realized by a comparable simple and less space-consuming semiconductor circuitry.

SUMMARY OF THE INVENTION

The object of the present invention is achieved by a method of optimizing the timing between signals to be latched and a respective latching clock signal with respect to a given circuitry arrangement with the features of independent claim 1. The object is further achieved by a method for latching received signals according to independent claim 8 as well as by an apparatus for optimizing the timing between signals according to claim 10.

The inventive method of optimizing the timing between signals according to a best mode for carrying out the same is adapted and arranged in order to optimize the timing between signals to be latched and a respective latching clock signal with respect to a given circuitry arrangement in which the signals to be latched are received and travel along certain data lines in order to be transferred to the respective latching means.

The inventive method of optimizing the timing between signals comprises a step (a) in which target timing data which are descriptive for a target timing between signals to be latched and said latching clock signal are received, generated and/or provided.

Additionally a step (b) is given in which test timings which are descriptive for test timings of said latching clock signal are received, generated and/or provided.

Additionally, within a further step (c) a test input signal is received, generated and/or provided as a test signal or sample signal to be latched, in particular in the same manner as the signals to be latched.

For each test timing the following processes are carried out according to a step (d). First of all, for each test timing a delay test value for a clock delay line is generated, received and/or set. The respective delay test values describe the delay which is received by a clock signal which travels along said clock delay line. Then, a clock signal is input and thereby received through said clock delay line. Said test input signal is input and thereby received as a sample signal through a sample signal line. This is carried out in particular simultaneously and further in particular at respective input sections of said clock delay line and said sample signal line, respectively. After having traveled over the respective clock delay line and the respective sample signal line the phase difference between the clock signal and the sample signal is measured in particular at end sections or output sections of said clock delay line and said sample signal line, respectively. The measured phase difference is majorly ruled by the natural delay of the sample signal stemming from the different interactions of the sample signal with the circuitry when traveling over the sample signal line. Additionally, the delay of the clock is also important and is also given by the different interactions of the clock signal with the circuitry arrangement when traveling over the clock delay line. The clock signal additionally carries the artificial delay which is ruled by the delay test value according to the respective test timings. Therefore for each test timing phase differences between the sample signal and the respective clock signal carrying a delay according to the delay test value are obtained.

In a further step (e) the obtained phase differences are compared to the target timing data describing a desired delay or phase difference between a sample signal and the clock signal and in particular a desired phase difference or delay between potential signals to be latched and the clock signal in particular the latching clock signal.

Finally in a further step (f) a distinct delay test value is chosen and set as a delay value for said clock delay line for operation for which the respective phase difference to occur fits best to the target timing data.

It is therefore a key aspect of the present invention and according to a best mode for carrying out the invention to sweep in connection with a test input signal as a sample signal through a set of delay test values according to given test timings, to accordingly measure the occurring phase differences and delays between the sample signal and the respective clock signal carrying the delay test value and to choose and to set the distinct delay test value as a delay value for the clock delay line for operation for which the phase difference and therefore the delay between the signals to be latched and the latching clock signal come as close as possible to the desired situation described by the respective target timing data.

According to a preferred embodiment of the inventive method of optimizing the timing between signals and according to a further best mode for carrying out the invention a set of consecutively or strictly monotonically ordered test timings and delay test values is used. This in particular simplifies the process of sweeping through the set of possible delay test values.

A further simplification is given if according to a further additional or alternative embodiment of the present invention and according to a further best mode for carrying out the invention a set of temporally equidistant test timings and delay test values is used.

According to a further embodiment of the present invention and according to a further best mode for carrying out the present invention for each setting of the delay test value an "early" signal or an "late" signal is generated from the obtained phase difference which in each case indicates that the clock signal is earlier or later, respectively, with respect to the respective sample signal.

In this case according to a further preferred embodiment of the present invention and according to a further best mode for carrying out the present invention a delay test value is chosen as a delay value and set for operation which is in this case a n-th delay test value either before or after a distinct delay test value for which a first "early" or a first "late" signal or a change from "early" to "late" or from "late" to "early" occur. This means, that reference is taken to a change from "early" to "late" or from "late" to "early" with respect to the set of delay test values.

It is of further advantage when according to a further embodiment of the present invention and according to a further best mode for carrying out the present invention n is chosen to be 1 in order to achieve at least approximately synchronicity between signals on said sample signal line and said clock signal of said clock delay line.

According to a further advantageous embodiment of the present invention and according to a further best mode for carrying out the present invention a non-feedback phase detection/phase alignment circuit is employed.

It is a further aspect of the present invention to provide a method for latching received signals. This method comprises a process of adjusting the timing between said received signals to be latched in the latching clock signal. The respective process for adjusting the timing is carried out according to the present invention as described above, i.e. the inventive method of optimizing the timing between signals to be latched and a respective latching clock signal is given and involved.

A further aspect of the present invention and according to a further best mode for carrying out the present invention is given if the process of adjusting the timing between said signals to be latched and the latching clock signals carried out in repetition.

According to a further aspect of the present invention and a further best mode for carrying out the same an apparatus is provided which is adapted, arranged and which comprises means for carrying out the inventive method of optimizing the timing between signals to be latched and a respective latching clock signal with respect to a given circuitry arrangement.

In this apparatus a delay unit may be provided which is adapted in order to realize a controlled additional delay with respect to a clock signal.

Ssaid delay unit may be one of the group which comprises inverter delays, capacitive delays and analog current node delays.

These and further aspects of the present invention will be elucidated by taking reference to the following remarks:

This invention inter alia solves problems associated with optimizing the timing between synchronous signals and their latching signal. For example, memory chip applications, multiple address signals are driven to a chip from an external source and latched with a clock signal also driven to the chip from the outside. Ideally, the clock signal would arrive at the latches together with the other signals in the center of the latch's setup and hold window, thus ensuring that the signal is properly latched, with margin for noise. The problem is that the clock and other signals encounter much variability along their path to the latch, such as unequal trace lengths and receiver differences, which in turn skews the clock relative to the signals. This patent proposes a simple and effective solution to compensate, and thus optimize the setup and hold time window.

The problem can, or has been solved in a variety of fashions, but all are either too complex, or do not solve the problem completely. The most effective, yet most complex form of solving this problem is by use of a dynamic clock alignment circuit, such as a delay lock loop (DLL) or a phase lock loop (PLL). The problem is that these circuits are relatively complex, consuming large silicon area and power. In addition, if poorly designed, the results can worsen the timing. Another very simple, but not so effective method is to use a one-time trimming of the skew via fuses or mask options. The obvious problem with this method is that the skew from the system outside of the chip cannot be compensated, as settings are fused independent of applications, nor can the voltage and temperature changes.

The invention solves the problem using a clock alignment circuit, similar to what might be used in a more complex DLL or PLL. A sweep of delays is carried out one or more times, depending on how often one wishes to calibrate the timing. The difference to a DLL or PLL is that the circuit contains no dynamic feedback loops and is therefore very simple and stable. The circuit can be further simplified by allowing control from the outside via the chip interface. In both cases, a protocol is needed between the chip and the controller. For instance, the controller needs to toggle the clock and all signals to be calibrated for a defined amount of time, at the end of which, the calibrations will be finished and the setup and hold time optimal.

A big advantage of this circuit, as compared to a DLL/PLL method is that the circuit can be used for smaller granularities of signals. For example, if 16 signals need to be aligned to one clock, a typical DLL solution would align the clock to the center signal. The problem is that it is difficult to align the other 15 signals to the center signal, thus leading to another source of skew. The invented circuit, on the other hand, is very simple and compact so that it can be used at multiple locations, for instance every 4 or 8 signals, thus reducing the skew within the signal groups. A DLL/PLL is simply too large and power consuming to use multiple times.

The inventive step is the use of a non-feedback phase alignment circuit to dynamically optimize the setup and hold time of synchronous circuits. In addition, the system protocol interfacing the chip to work in conjunction with the circuit is an inventive step.

FIG. 2 shows a simplified schematic which can be used to demonstrate both the prior art and the invention. The next Figure will show the waveforms. The combination of the phase detector (PD), the feedback control, and the delay line are the same basic elements of DLL. The difference in the invention is that the loop is not functionally closed, which means there is no dynamic loop behavior. Instead, the control sweeps through all or some of the values, controlling the delay, during which the output of the PD is only observed by the control and the information later used to make a final setting of the delay. During the sweep, the PD output has no effect on the control system, hence, opening the loop. The lack of the loop dynamics greatly simplifies the circuit compared to a complete DLL.

FIG. 3 shows the circuit waveforms. The "signals" represent the multiple synchronous signals that will be latched by "clk". The "early" and "late" signals are the result of the delayed clock toggling either before or after the "signals" edge. In the sample, and Alexander phase detector was used, but many different possibilities exist and the form of "early" and "late" could be different. Important is determining when the clock signal "passes" the edge of the "signals". It should also be explained here that the overlapping "clk" signals is only a representation of the different positions that the "clk" signal will assume from period as the delay is changed by the control circuit. The final chosen delay in this example will correspond to the point around where "late" toggles in the cycle after which "early" had toggled. This is the point where the clock edge aligns with "signals".

SHORT DESCRIPTION OF THE FIGURES

These and further aspects of the present invention will also be explained by taking reference to the accompanying figures.

DETAILED DESCRIPTION OF PREFERRED EMBODIMENTS

In the following elements and structures with similar or equivalent functionalities will be described and denoted by the same reference symbols. Not in each case of their occurrence a detailed description thereof is repeated.

Figure 1:
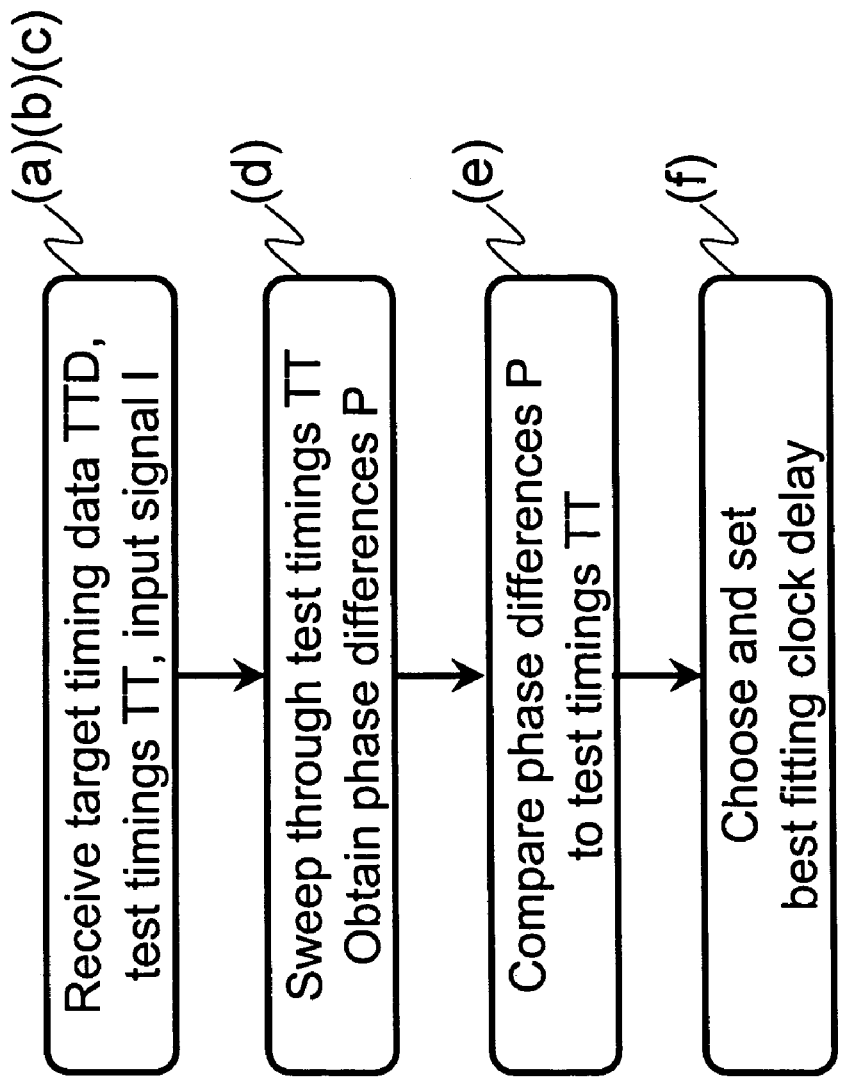
FIG. 1 is a schematical block diagram describing basic elements of the inventive method of optimizing the timing between signals to be latched and a respective latching clock signal in accordance to a preferred embodiment of the present invention.

FIG. 1 is a schematic block diagram describing a first embodiment of the present invention in the sense of a method of optimizing the timing between signals to be latched and a respective latching clock signal.

A first subprocess of receiving a target timing data TTD, the test timings TT as well as the test input signal I unifies the steps (a), (b), and (c) of the present invention. It follows a step (d) in which a process of sweeping through the test timings and the respective delay test values is realized and in which the respective phase differences between the test input signal I as a sample signal and the respective clock signals C are measured. In a following step (e) the obtained phase differences P are compared to the target timing data TTD. That means that it is checked on whether or not there is a delay test value stemming from the test timings TT which fulfils the requirements of the target timing data TTD best. In a following step (f) the comparison result is used in order to choose and set this distinct delay test value as a delay value for the clock delay line CDL for operation. That means that in the process of operation received latching clock signals will receive an additional delay according to the chosen delay test value. This is done in order to appropriately set the delay or the phase difference between the received signals to be latched and the respective latching clock signal.

Figure 2:
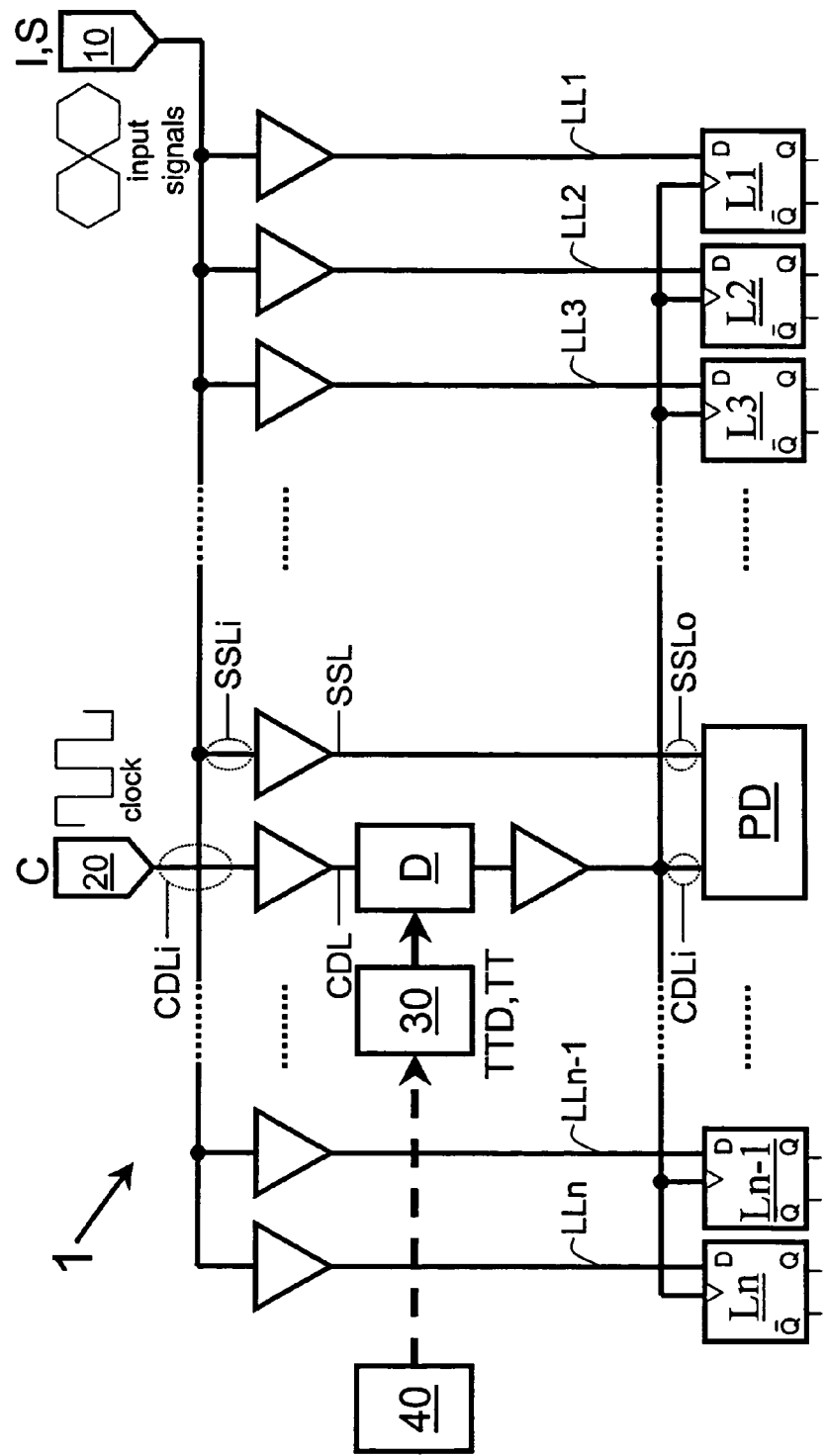
FIG. 2 is a schematical block diagram describing a circuitry arrangement in which the invention can be applied.

FIG. 2 is a schematical block diagram describing a circuitry arrangement in which the inventive method of optimizing the timing between signals to be latched and a respective latching clock signal can be applied.

The circuitry arrangement 1 comprises a signal input section 10 through which input signals can be received. Additionally a clock signal input section 20 is provided in order to receive and/or to generate respective clock signals as latching clock signals. Connected through the data input section 10 are so called latching lines LL1 to LLn feeding the received input signals I, S to the connected latches L1 to Ln. Additionally, a sample signal line SSL is provided and also connected to the data input section 10. Said sample signal line SSL has a comparable structure with respect to the latch lines LL1 to LLn so that the same or a comparable interaction interaction and the same or a comparable delay will occur for a sample signal S traveling through the sample signal line SSL when compared to an input signal I traveling to one of the latch lines LL1 to LLn.

Further in addition a clock delay line CDL is provided in which a delay section D is arranged which is adapted in order to add an additional delay to a clock signal C traveling through the clock delay line CDL. From the clock delay line CDL after having added an additional delay by the action of the delay section D the clock signal C is supplied to all of the latching units L1 to Ln in order to initiate the latching process with respect to the input data supplied through the latching lines LL1 to LLn.

The delay section D of the clock delay line CDL is controlled by a control section 30 which uses an evaluates the target timing data TTD and the test timings TT in order to set and sweep through the delay test values and in order to set a distinct delay value for th delay section D in operation. Optional is an external control 40 which might be adapted and arranged in order to control the sweeping process, the setting process as well as for setting the time in which a calibration may take place.

Figure 3:
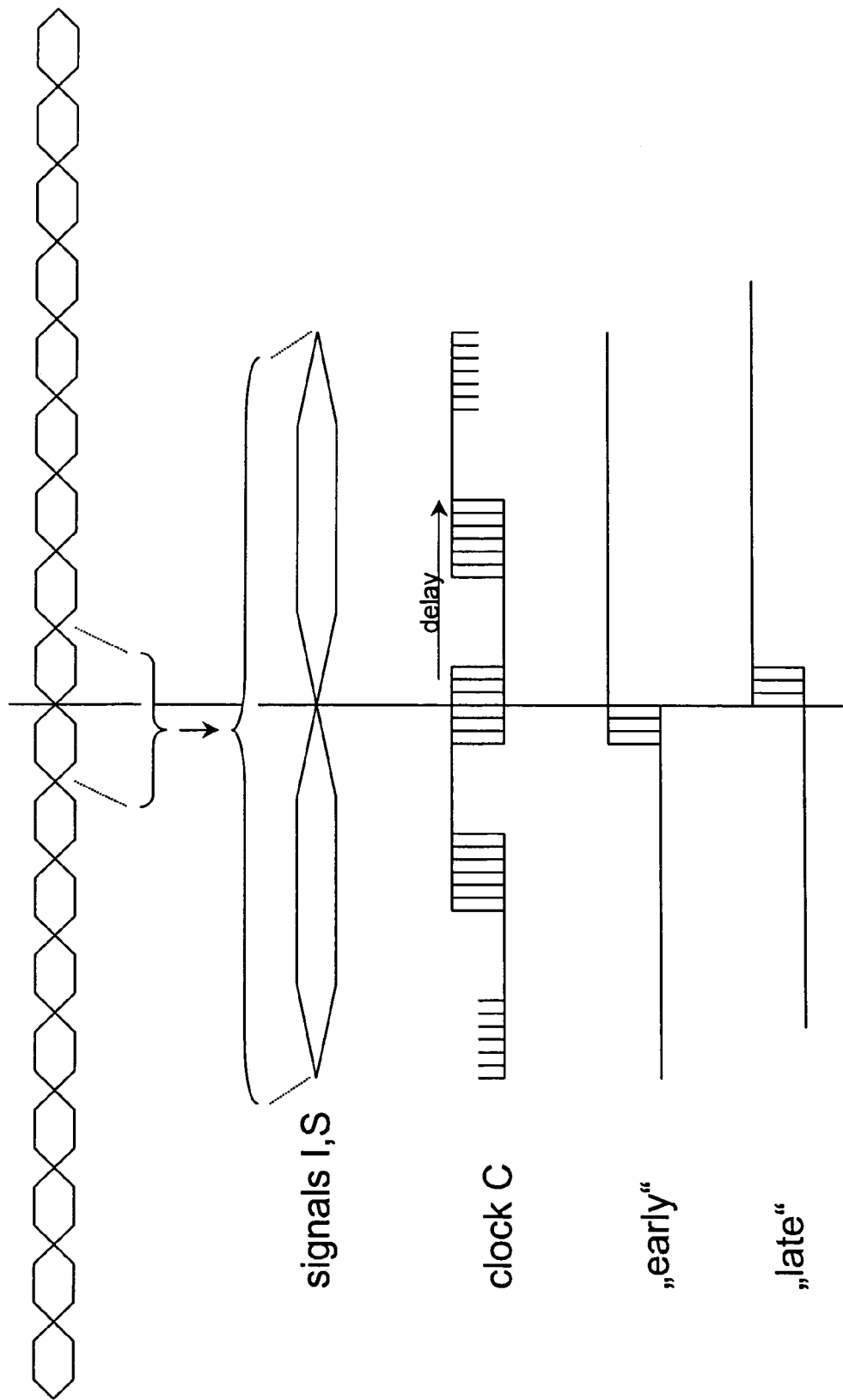
FIG. 3 is a schematical diagram which demonstrates the signaling processes taking place in accordance to a preferred embodiment of the present invention.

FIG. 3 is a schematical diagram with respect to the signaling structure and has already been described above.

REFERENCE SYMBOLS 1 circuitry arrangement according to the present invention
10 signal input section for input signals to be latched
20 clock signal input section for clock signals or latching clock signals
30 control unit, control section
40 external control unit, external control section
C clock signal, latching clock signal
CDL clock delay line
CDLi input section of CDL
CDLo end section/output section of CDL
D delay unit, delay section
I input signal, test input signal
L1–Ln latch unit
LL1–LLn latch line P signal phase
PD phase detector
SSL sample signal line
SSLi input section of SSL
SSLo end section/output section of SSL
TT test timing
TTD target timing data

What is claimed is:

1. Method of optimizing the timing between signals to be latched and a respective latching clock signal with respect to a given circuitry arrangement,
   (a) receiving and providing target timing data (TTD), which are descriptive for a target timing between said signals to be latched and said latching clock signal,
   (b) receiving and providing test timings (TT), which are descriptive for test timings of said latching clock signal,
   (c) receiving and providing a test input signal (I), as a test signal to be latched,
   (d) for each of said test timings (TT):
      setting and receiving a delay test value of a clock delay line (CDL), describing the delay which is received by a clock signal traveling along said clock delay line (CDL),
      inputting and thereby receiving a clock signal (C) through said clock delay line (CDL) and said test input signal (I) as a sample signal (S) through a sample signal line (SSL) simultaneously and in particular at respective input sections thereof (CDLi, SSLi),
      measuring a phase difference between said clock signal (C) and said sample signal (S) at respective end sections or output sections (CDLo, SSLo) of said clock delay line (CDL) and of said sample signal line (SSL), respectively,
   (e) comparing the obtained phase differences to said target timing data (TTD), and
   (f) choosing and setting a distinct delay test value as a delay value for said clock delay line (CDL) for operating for which the respective phase difference fits best to the target timing data (TTD);
      wherein a non-feedback phase detection/phase alignment circuit (PD) is employed.

2. Method according to claim 1, wherein a set of consecutively or strictly monotonically ordered test timings and delay test values is used.

3. Method according to claim 1, wherein a set of temporaily equidistant test timings and delay test values is used.

4. Method according to claim 1, wherein for each setting of a delay test value from the obtained phase difference an "early" signal or an "late" signal is generated which indicates that the clock signal is earlier or later, respectively, than the respective sample signal (S).

5. Method according to claim 4, wherein a delay test value is chosen as a delay value and set for operation which is an n-th delay test value one of before or after a distinct delay test value for which a first "early" or a first "late" signal occurs.

6. Method according to claim 4, wherein n is chosen to be 1, in order to achieve at least approximate synchronicity between signals on said sample signal line (SSL) and said clock signal (C) of said clock delay line (CDL).

7. Method for latching received signals, comprising a process of adjusting the timing between said received signals to be latched and a latching clock signal, wherein said process of adjusting is carried out by:
   (a) receiving and providing target timing data (TTD), which are descriptive for a target timing between said signals to be latched and said latching clock signal,
   (b) receiving and providing test timings (TT), which are descriptive for test timings of said latching clock signal,
   (c) receiving and providing a test input signal (I), as a test signal to be latched,
   (d) for each of said test timings (TT):
      setting and receiving a delay test value of a clock delay line (CDL), describing the delay which is received by a clock signal traveling along said clock delay line (CDL),
      inputting and thereby receiving a clock signal (C) through said clock delay line (CDL) and said test input signal (I) as a sample signal (S) through a sample signal line (SSL) simultaneously and in particular at respective input sections thereof (CDLi, SSLi),
      measuring a phase difference between said clock signal (C) and said sample signal (S) at respective end sections or output sections (CDLo, SSLo) of said clock delay line (CDL) and of said sample signal line (SSL), respectively,
   (e) comparing the obtained phase differences to said target timing data (TTD), and
   (f) choosing and setting a distinct delay test value as a delay value for said clock delay line (CDL) for operation for which the respective phase difference fits best to the target timing data (TTD);
      wherein a non-feedback phase detecting/phase alignment circuit (PD) is employed.

8. Method according to claim 7, wherein the process of adjusting the timing between said signals to be latched and the latching clock signal is carried out repeatedly.

9. Method according to claim 8, wherein a set of consecutively or strictly monotonically ordered test timings and delay test values is used.

10. Method according to claim 8, wherein a set of temporarily equidistant test timings and delay test values is used.

11. Method according to claim 8, wherein for each setting of a delay test value from the obtained phase difference an "early" signal or an "late" signal is generated which indicates that the clock signal is earlier or later, respectively, that the respective sample signal (S).

12. Method according to claim 11, wherein a delay test value is chosen as a delay value and set for operation which is an n-th delay test value one of before or after a distinct delay test value for which a first "early" or a first "late" signal occurs.

13. Method according to claim 11, wherein n is chosen to be 1, in order to achieve at least approximate synchronicity between signals on said sample signal line (SSL) and said clock signal (C) of said clock delay line (CDL).

14. Apparatus which is adapted and arranged for optimizing the timing between signals to be latched and a respective latching clock signal, the apparatus comprising:
   a signal input section though which input signals can be received;
   a clock signal input section;
   a plurality of latching lines coupled to the signal input section;
   a sample signal line coupled to the signal input section;
   a click delay line coupled to the clock input section, the clock delay line including a delay section;

a phase detector coupled to the sample signal line and the clock delay line, wherein the phase detector comprises a non-feedback phase detecting/phase alignment circuit;

a plurality of latches, each latch having a data input coupled to a respective one of the latching lines and each latch having a clock input coupled to the clock delay line.

15. Apparatus according to claim 14, wherein the delay section is adapted in order to realize a controlled additional delay with respect to a clock signal.

16. Apparatus according to claim 15, wherein said delay section comprises a delay selected from the group consisting of inverter delays, capacitive delays and analog current node delays.

17. Apparatus according to claim 14, wherein the sample signal line has substantially the same structure as the latch lines.

18. Apparatus according to claim 14, further comprising a control section with an output coupled to the delay section, the control section controlling an amount of delay of the delay section.

19. Apparatus according to claim 18, wherein the control section uses an evaluation of target timing date and test timings to set and sweep through delay test values for the delay section.

* * * * *

UNITED STATES PATENT AND TRADEMARK OFFICE
CERTIFICATE OF CORRECTION

PATENT NO. : 7,024,326 B2
APPLICATION NO. : 10/835393
DATED : April 4, 2006
INVENTOR(S) : Nygren It is certified that error appears in the above-identified patent and that said Letters Patent is hereby corrected as shown below:

Column 4,
Line 4, delete "Ssaid" and insert -- Said --.

Column 5,
Line 19, delete "and" and insert -- an --.

Column 6,
Line 2, delete "fulfils" and insert -- fulfills --.
Line 27, delete "interaction interaction" and insert -- interaction --.
Line 41, delete "an" and insert -- and --.
Line 44, delete "th" and insert -- the --.

Column 7,
Line 43, delete "detection" and insert -- detecting --.
Line 48, delete "temporaily" and insert -- temporarily --.

Column 8,
Line 46, delete the second "that" and insert -- than --.
Line 60, delete "though" and insert -- through --.
Line 66, delete "click" and insert -- clock --.

Signed and Sealed this

Sixth Day of February, 2007

JON W. DUDAS
*Director of the United States Patent and Trademark Office*